United States Patent [19]
Bunton

[11] Patent Number: 5,151,697
[45] Date of Patent: Sep. 29, 1992

[54] DATA STRUCTURE MANAGEMENT TAGGING SYSTEM

[75] Inventor: Suzanne Bunton, Seattle, Wash.

[73] Assignee: Board of Regents of the University of Washington, Seattle, Wash.

[21] Appl. No.: 598,418

[22] Filed: Oct. 15, 1990

[51] Int. Cl.$^5$ .............................................. H03M 7/30
[52] U.S. Cl. ......................................... 341/51; 341/79
[58] Field of Search ............................. 341/51, 65, 79

[56] References Cited

U.S. PATENT DOCUMENTS

| | | | |
|---|---|---|---|
| 4,464,650 | 8/1984 | Eastman et al. | 340/347 |
| 4,491,934 | 1/1985 | Heinz | 364/900 |
| 4,535,320 | 8/1985 | Weaver | 341/65 |
| 4,558,302 | 12/1985 | Welch | 340/347 |
| 4,612,532 | 9/1986 | Bacon et al. | 340/347 |
| 4,814,746 | 3/1989 | Miller et al. | 341/95 |
| 4,847,619 | 7/1989 | Kato et al. | 341/106 |
| 4,870,415 | 9/1989 | Van Maren et al. | 341/94 |
| 4,876,541 | 10/1989 | Storer | 341/51 |
| 4,881,075 | 11/1989 | Weng | 341/87 |
| 4,889,148 | 2/1990 | Sato et al. | 341/65 |
| 4,990,910 | 2/1991 | Takishima et al. | 341/67 |
| 5,010,345 | 4/1991 | Nagy | 341/65 |

FOREIGN PATENT DOCUMENTS 0350281 10/1990 European Pat. Off. .

OTHER PUBLICATIONS

Victor S. Miller and Mark N. Wegman, "Variations on a Theme by Ziv and Lempel," NATO ASI Series, vol. F12, 1985.

Terry A. Welch, "A Technique for High-Performance Data Compression," Computer, pp. 8–19.

"Improved Ziv-Lempel Type Data Compression Method," IBM Technical Disclosure Bulletin, vol. 28, No. 3, Aug. 1985.

*Primary Examiner*—Marc Hoff
*Attorney, Agent, or Firm*—Christensen, O'Connor, Johnson & Kindness

[57] ABSTRACT

An adaptive data compression and decompression system having a fixed dictionary size is disclosed. The compression system builds a data dictionary tree such that each path in the tree represents a string ω, which was, along with its prefixes, in the input character stream being compressed. The root node and all nodes that do not represent a single character word in the input stream are tagged. Additionally, each non-root node is associated with a unique output code. As strings from the input stream of characters are matched against the tree, the node tags are updated. When a match fails, a new node is added. The new node is associated with a new code and a tag. When the dictionary is full, the root tag identifies the tag of a node that can be deleted. The decompression system builds a similar tapped decompression dictionary.

19 Claims, 15 Drawing Sheets

STRING TABLE

| INPUT STRING | OUTPUT CODES |
|:---:|:---:|
| a | 0 |
| b | 1 |
| c | 2 |
| ab | 3 |
| ba | 4 |
| aba | 5 |
| abaa | 6 |
| abac | 7 |
| ca | 8 |

FIG.1A.
PRIOR ART

| INPUT SYMBOLS | a | b | a | b | a | b | a | a | b | a | c |
|---|---|---|---|---|---|---|---|---|---|---|---|
| OUTPUT CODES | 0 | 1 | | 3 | | 5 | | | 5 | | 2 |

NEW STRING ADDED TO TABLE: 3  4  5  6  7

FIG.1B.
PRIOR ART

SPRING TABLE

| INPUT STRING | OUTPUT CODE | t(7) | TAG t(11) | t(15) |
|---|---|---|---|---|
| a | 0 | — | — | — |
| b | 1 | — | — | — |
| c | 2 | — | — | — |
| ab | 3 | 3 | 4 | 0 |
| ba | 4 | 1 | 1 | 1 |
| aba | 5 | 2 | 3 | 4 |
| abaa | 6 | 0 | 0 | — |
| abac | 7 | | 2 | 3 |
| ca | 8 | | 5 | 5 |

------ DICTIONARY FULL ------

| abaca | 6 | | | 2 |

ROOT TAG:   t(7)=4
            t(11)=0
            t(15)=1

FIG. 7.

COMPRESSOR

IF(LAST-MATCH-SUCCESSFUL)

PREV-NODE=NODE;
        NODE = $x$ IN $\{0..D-1\}$ s.t. DICTIONARY$[x]$ = NODE//INPUT;
    ELSE
        OUTPUT    = PREV-INPUT IF READY
                       = PREV-NODE OTHERWISE;
        READY     = TRUE;
        DICTIONARY[FREE] = PREV-NODE//PREV-INPUT;
        PREV-NODE = FREE
        FREE      = SUCC(FREE);
        NODE = $x$ IN $\{0...D-1\}$ s.t. DICTIONARY$[x]$ = PREV-INPUT//INPUT;
    LAST-MATCH-SUCCESSFUL = NODE IS DEFINED;
    PREV-INPUT = INPUT;
    INPUT      = READ();

TAGGING SCHEME:

IF (LAST-MATCH-SUCCESSFUL) AND NODE ≠ FREE

TAG[PREV-NODE]   = PREV-TAG;
        TAG'[PREV-TAG]   = PREV-NODE;
        PREV-TAG         = TAG;
        TAG            = TAG[NODE];
    ELSE
        FREE            = TAG'[ROOT-TAG];
        PREV-TAG         = TAG;
        TAG            = ROOT-TAG;
        ROOT-TAG         = ROOT-TAG+1 (MOD N)

FIG.9.

DECOMPRESSOR

```
IF(NODE<|Σ|)
    DICTIONARY[PREV-FREE]    =PREV-INPUT//NODE(3..11);
    PREV-PREV-NODE           =PREV-NODE;
    PREV-NODE                =FREE;
    PREV-FREE                =FREE;
    FREE                     =SUCC(FREE);
    REVERSE-OUT              =NODE(3..11);
    NODE                     =INPUT;
ELSE
    PREV-PREV-NODE           =PREV-NODE;
    PREV-NODE                =NODE;
    REVERSE-OUT              =DICTIONARY[NODE].PARENT;
    NODE                     =DICTIONARY[NODE].SYMBOL;
PREV-INPUT    =INPUT;
INPUT         =READ();
```

TAGGING ROUTINE:

```
TAG[PREV-PREV-NODE]     =TAG;
TAG'[TAG]               =PREV-PREV-NODE;
IF (NODE<|Σ|)
    TAG                 =ROOT-TAG;
    ROOT-TAG            =ROOT-TAG+1 (MOD N);
    FREE                =TAG'[ROOT-TAG];
ELSE
    TAG                 =TAG[NODE];
```

FIG. 12.

FIG.13.

```
STACK-QUEUE PROCESS

COUNT ← COUNT + 1
OUT ← STACK-QUEUE [FONT].SYMBOL         IF COUNT < #|D|-1
FONT ← STACK-QUEUE [FONT].NEXT          IF COUNT # = #|D|-1 OR DECODER DONE
TOP ← COUNT                             IF COUNT # = #|D|-1 OR DECODER DONE
TOP ← FONT
STACK-QUEUE [TOP].NEXT ← TOP            IF COUNT < #|D|-1
STACK-QUEUE [TOP].SYMBOL ← REVERSE OUT  IF COUNT ± #|D| OR DECODER DONE
STACK-QUEUE [BACK].NEXT ← TOP
BACK ← BOTTOM                           IF START_NEW_PARSE
BOTTOM ← FRONT                          IF START_NEW_PARSE
END_THIS_PHRASE ← (NODE<|Σ|)            IF START NEW PARSE
START_NEW_PARSE ← END_THIS_PARSE
```

DATA STRUCTURE MANAGEMENT TAGGING SYSTEM

TECHNICAL FIELD OF THE INVENTION

The invention relates to data compression and decompression systems and, more particularly, to a data compression system having adaptable encoding and decoding dictionaries.

BACKGROUND OF THE INVENTION

The term data compression refers generally to the process of transforming a set of data to a smaller representation from which the original or some approximation of the original can be extracted at a later time. A data compression process generally includes the steps of encoding a body of data into a smaller body of data and the step of decoding the compressed data back into the original body of data or an acceptable approximation thereof. One application for data compression is for textual data such as information in books, programming language source or object code, database information, numerical representations, etc. In these types of data, it is generally important to preserve the original data exactly by what is referred to as lossless data compression. While there are numerous applications for data compression, two of the most common applications include data storage and data communications.

In the design of a data compression system, there is a tradeoff between the benefits of obtaining compressed data versus the computational costs incurred by performing the encoding and decoding. Generally, compression is judged in terms of a compression ratio, which relates input character size to the output size. As computer technology advances, data compression is becoming a standard component of communication and data storage systems. A common computer configuration includes a data encoding/decoding chip at the ends of a communication channel. Alternatively, data compression software can be executed during the communication transmit and receive processes.

A widely used textual substitution data compressor is based on the Lempel and Ziv scheme. This scheme is described in detail in J. Ziv and A. Lempel, "Compression of Individual Sequences Via Variable Rate Coding," *IEEE Transactions on Information Theory*, IT-24(5):530–536, September 1978. A more pratical reduction of the Lempel and Ziv scheme was developed by Welch; this pratical scheme is described in T. A. Welch, "A Technique for High-Performance Data Compression," *Computer*, 8-19 (June 1984), and is the subject of U.S. Pat. No. 4,558,302. Generally, the scheme passes an input string to be compressed in accordance with a string table or dictionary that includes a list of previously parsed input strings. Thus, the string table is based on the data in the input string so that certain compressor characteristics are dependent upon the particular string being compressed. The general operation of the Liv-Zempel-Welch (LZW) encoder is described in conjunction with prior art FIGS. 1 and 2.

With reference to FIGS. 1a and 1b, the parsing of string abababaabacabacb by an LZW data compression algorithm is represented by a string table and a string addition table, respectively, The string is parsed over the alphabet $\Sigma = \{a, b, c\}$ and has an unbounded dictionary size. This alphabet is merely for descriptive purposes. An example of a realistic alphabet is the set of ASCII characters. The present invention improves on the LZW scheme by controlling the dictionary size and utilization.

The LZW scheme is organized around a string table that maps strings of input characters into fixed length codes. The string table has the property that for every string or word in the table its prefix strings are also stored in the table. For example, if the string $\omega K$ is composed of a string $\omega$ and a single extension character K is in the table, then the prefix $\omega$ is in the table, as are all prefixes of $\omega$.

The string table is initialized to the one letter strings over the alphabet $\{a, b, c\}$; each of these strings is assigned an output code $\{1, 2, 3\}$, respectively. The input character size is assumed to be 8-bits. The input string is analyzed character serially, in this case left to right, and the longest matched input string is parsed off at each pass and its code is output. The set of codes represents the compressed data.

With reference to FIG. 2, an encoding pass begins at block 10 by obtaining an extension character from the string. The extension character is always the first unmatched character from the input string. For the initialization, the extension character is the first character in the input string. At block 12, a check is made to determine whether the entire input string has been encoded. At block 14, there is input available. The extension character is appended to the previously matched string, i.e., the prefix string, if there is one and the new string is matched against the strings in the string table. At block 16, when the new string is matched, a new prefix string is created and the process returns to block 10.

If, at block 14, no match is found, at block 18, the new string is added to the string table at an unused code address. The code related to the last matched string is output. The process returns to block 10. If the end of the file is reached, at block 20, the code for the prefix is output.

In the example shown in FIG. 1, the string table is initialized with the characters of the alphabet associated with codes 0-2. Assuming that the first 3 entries of the string table are completed, a parsing example using the string abababaabacabacb is described. At the beginning of the first iteration a is obtained from the input string and matched against the string entries. Since a matches the first entry in the string table, the extension character b is obtained from the input string and appended to the prefix a to form string ab. An attempt is then made to match ab in the string table. Since no match is made, the string ab is added to the string table at position 3 and a new code 3 is added to the table. The code value 0, for the matched string a is then output.

Since the last match was not successful, the next iteration begins using extension character b, which is the last unmatched character in the input string as a prefix. The string b matches the b entry in the table. Since the match was successful, the next extension character a, i.e., the third character a in the input string, is read from the input string and appended to prefix b. A match of string ba is attempted and fails. When the match fails, an entry for ba is added to the string table and assigned output code 4. Code 1, related to matched string b, is output and a new iteration begins with the unmatched extension character a as a prefix. This process continues until the entire input string is parsed.

Decompression is performed by reconstructing the encoding string table. For example, the decoder will receive 12435 ... The decoder reconstructs the string table starting from an initial table consisting of the known single character entries {a, b, c}. For example, after output codes 0 and 1 are decoded as a and b, the decoder enters ab into the string table with code 3, the next available code. Output code 3 is then received and decoded as ab, and the entire decoded string is abab. The decoder identifies the next string table entry as ba since b was the last matched string and a is its extension character. The strings produced by the decoding method are backwards since they are decoded from end to beginning, i.e., right to left. Thus, some type of string buffering and reversal are performed. As the string is decoded, each symbol is buffered. When the code is completely decoded, the buffer contents are output in reverse order.

In the example, the output codes are a fixed length. A common length is 12-bits. Thus, approximately 4000 different string table entries can be encoded. The dictionary growth mechanism defined by the addition of the last parsed word concatenated with the first unmatched character causes the dictionary to contain every prefix of every word it holds. For that reason, an LZW implementation may use a large amount of dictionary space. Furthermore, even if the characteristics of the data change after the beginning of the input string is encoded, the early word entries will remain in the string table.

Since realistic implementations have finite memory, dictionary or string table growth must be bounded. Given a limited amount of dictionary space, it is desirable to establish a fully adaptable dictionary, that is, a dictionary that continues to change with the input stream, even after it fills. An adaptable dictionary provides better compression as opposed to a dictionary that reflects only the initial portion of the input string, and therefore may not reflect changing patterns over the entire input stream file.

A number of dictionary management schemes have been developed which attempt to ensure the adaptation of the dictionary for optimal compression. When designing and adapting a dictionary management scheme, compression success and memory management expense are balanced. It has been shown that without adaptation every doubling of the dictionary size usually results in an improvement in the compression ratio for sufficiently large input streams.

A dictionary management scheme referred to as FLUSH builds a dictionary of a given size and then starts completely over with dictionary building if the compression ratio falls below a predetermined limit. Optionally, the dictionary begins with 512 entries, i.e., a 9-bit output code. When the dictionary fills, its size doubles and the code length increases by one. This process continues until a maximum size is reached, i.e., 64K entries with 16-bit codes. No further additions are made to the dictionary and only matched strings are encoded. The compression ratio is monitored and, if it drops below a predetermined threshold, the dictionary is flushed and returned to its original 512-word size. This process repeats until the entire input string has been encoded. The variable-sized dictionary aspect of FLUSH methodology is advantageous when used for compressing small files. However, extra buffering overhead is required for the variable width output codes. This is a significant consideration since outputs must be handled bit serially.

A second method for dictionary management is the least recently used (LRU) methodology. A detailed description of this method is described in V. Miller and M. Wegman, "Variations On a Theme" by Ziv and Lempel, *Combinatorial Algorithms on Words*, Springer-Verlag, 1985, 131-140. Typically, an LRU implementation uses a linked list or queue of pointers to a set of tree nodes. The queue orders the tree nodes by recency of use. The LRU queue must be doubly linked to allow time constant deletions. For time constant searches, each tree node also keeps a pointer to its associated link in the LRU queue. Thus, four extra pointers per dictionary entry are used. This increases the amount of memory required to store the dictionary. Additionally, for every input character scanned, the location, removal, and insertion of a queue link is necessary. Thus, the computation requirements substantially exceed those of the FLUSH method.

A third dictionary management methodology is SWAP. In this scheme a primary and a secondary dictionary are maintained. When the primary dictionary fills, insertions are made in the secondary dictionary while the encoding continues based on the contents of the primary dictionary. Whenever the secondary dictionary fills, the roles of the dictionaries are swapped and the primary dictionary is reset, e.g., flushed and redefined, which the secondary dictionary is used for encoding. One variation of SWAP is a method that begins by filling the secondary dictionary once the primary dictionary is half full, and swaps the dictionaries whenever either dictionary fills. Both of the SWAP schemes require that memory and computation resources of an LZW compressor be doubled.

SUMMARY OF THE INVENTION

The present invention is an adaptive data compression and decompression method and apparatus for compressing an input string of character signals and decompressing a code set while maintaining a data dictionary of size D. The method includes the steps of establishing a dictionary in memory, wherein each string entry, and its prefixes, represents a string of data character signals encountered in the input string of character signals. Each string entry is related to a unique output code signal, and each string entry of length greater than one character is related to a string entry tag. A master tag that is an index to the string entry tags is maintained. The encoding process requires searching of the string of input character signals by comparing the string to the stored string entries to determine a longest match. The code signal related to the longest match is output. An extended string entry related to the longest match followed by a next unmatched data character signal from the input string of character signals is added to the dictionary along with an available code. The tagging portion of the method then updates the master tag and each string entry tag related to the extended string entry and to each string entry that is a prefix thereof. The string entry tag updates are based on the master tag value. If the dictionary is full after an encoding pass, the string entry having a tag identified by the master tag is freed prior to performing the step of searching. In this manner, the next added string is added to the freed string entry and the dictionary contents adapt to the most recently coded input strings. The master tag always identifies a string entry that can be deleted without interrupting the dictionary data structure, i.e., it is not a prefix of any other string entry in the dictionary. Additionally, the identified string was not recently used relative to other non-prefix strings.

In accordance with further aspects of the present invention, the dictionary is established as a trie structure having a root node, permanent child nodes and a set of transient nodes. The edge labels of the trie are characters from the alphabet over which the input string of character signals is created. A string entry in said dictionary is associated with a related node and is identified by traversing a path from the root node to the related node and concatenating the characters along the path. The number of transient nodes N is equal to dictionary size D minus the size of the alphabet $|\Sigma|$. The root node is associated with the master tag and each transient node has an associated string entry tag. Each tag is unique.

Prior to establishing the dictionary, the master tag is initialized. The step of updating the master tag and each string entry tag includes the steps of storing the master tag in a temporary tag and then assigning a new master tag, such that the new master tag equals (master tag + 1) MOD (number of transient nodes N). Each string entry node related to the extended string entry and its prefixes are assigned the tags of their parent nodes by swapping the temporary tag with a string entry node tag after each prefix string is matched.

In accordance with other aspects of the present invention, when the dictionary is full, a string entry having an associated tag equal to the master tag is freed. The freed string entry's associated code becomes the available code that is assigned when the next new node is added.

Another object of the present invention is to provide a method for decompressing the code signals. A decoding dictionary is established in memory, wherein each string entry in the decoding dictionary represents a string of data character signals decoded from the code signals. Each code signal is an address location in the memory, that location including character and tag information. A set of permanent string entries related to single character strings in the alphabet are preestablished in the decoding dictionary. The decoding process includes obtaining a current code which is essentially the current code address in the decoding dictionary. The current string entry related to the address is output. Additionally, the string entry tags related to the current string entry and each string entry including a prefix of the current string entry are updated after storing in a next tag the string entry's tag. A new string entry comprised of a previously decoded string entry identified by a previous code followed by a first character from the current string entry is entered in the decoding dictionary. The new string is assigned a previous tag, which represents its longest prefix's old tag. The previous tag is reset to the next tag, and the current code is assigned to the previous code to be used in the next decoding pass. During the decoding pass the master tag is updated. If the decoding dictionary is full, the string entry identified by the master tag is freed. In this manner the building of the decoding dictionary parallels the building of the encoding dictionary.

Compression and decompression apparatus for carrying out the compression and decompression methods are provided in accordance with the present invention.

The present invention includes a memory management system in conjunction with an LZW-type compressor-decompressor system which achieves a desirable level of compression performance. The method involves two parallel and nearly independent encoding processes, each of which is roughly equivalent in memory and computational requirements to an LZW encoder without any dictionary management. The two processes are an encoder process and a tagging process. Similarly three parallel decoding processes for decoding, tagging and reversing output strings are provided.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1a and 1b are table representations of a prior art compression scheme;

FIG. 7 is a table representation of a data compression process in accordance with the present invention;

FIG. 9 is a procedural diagram of a prior art compression routine and a dictionary management routine in accordance with the present invention that may be implemented so that it runs in lock step with the compressor;

FIG. 12 is a procedural diagram of a prior decompression routine and a dictionary management routine in accordance with the present invention that may be implemented in lock step; and FIG. 13 is a procedural diagram of a stack-queue handling routine in accordance with the present invention.

DETAILED DESCRIPTION OF THE PREFERRED EMBODIMENTS

The present invention provides a method and apparatus for adaptable data compression and decompression using a fixed-size dictionary. The system provides a straightforward method for identifying a dictionary entry having two characteristics. The first characteristic is that the entry can be freed, e.g., deleted, without interrupting the data structure. The second characteristic is that the entry was not recently used, relative to the other entries. It would not be expected that this word be matched in the near future even when the input stream content is changing. The system utilizes a method of tagging dictionary entries and for maintaining a master tag. The master tag identifies the tag of the entry that can be deleted, which is always an entry having the two characteristics.

Using the present system, a dictionary is built according to the abovedescribed LZW scheme. As the dictionary is built, the entries are tagged. Once the dictionary reaches a predetermined size D, before each match is performed, a dictionary entry having a tag equal to the master tag is deleted so that the next unmatched word can be entered in the dictionary. By maintaining the dictionary entries' tags and a master tag according to the present invention, the dictionary size is maintained at a predetermined level and the dictionary entries are able to adapt to reflect the content of the input string words that were recently parsed. Space requirements for storing and manipulating the data dictionary are maintained at a predetermined level and a good compression ratio is obtained because of the adaptability of the content of the dictionary.

Figure 2:
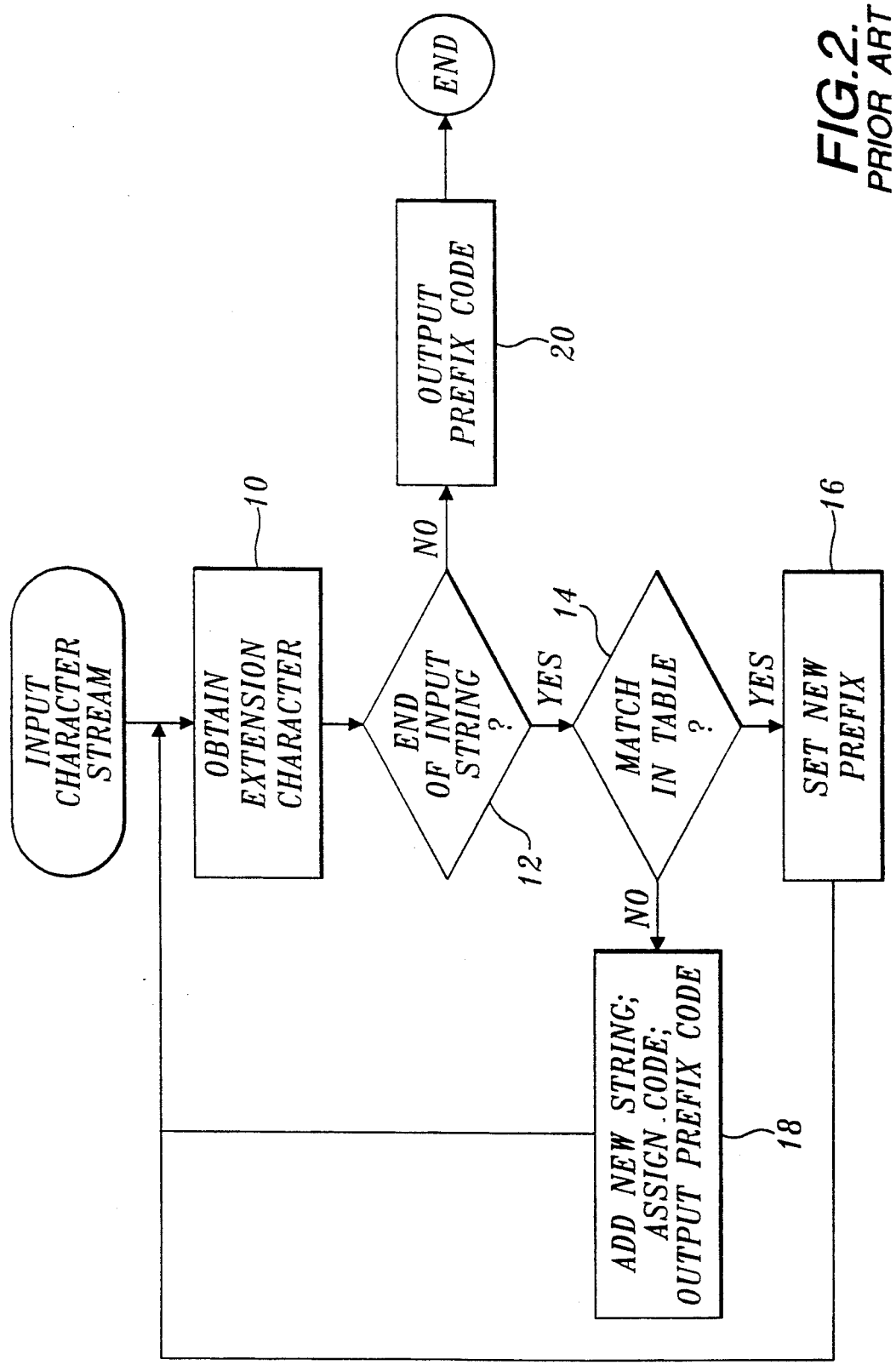
FIG. 2 is a flow diagram of the prior art compression scheme represented in FIGS. 1a and 1b.
Figure 3:
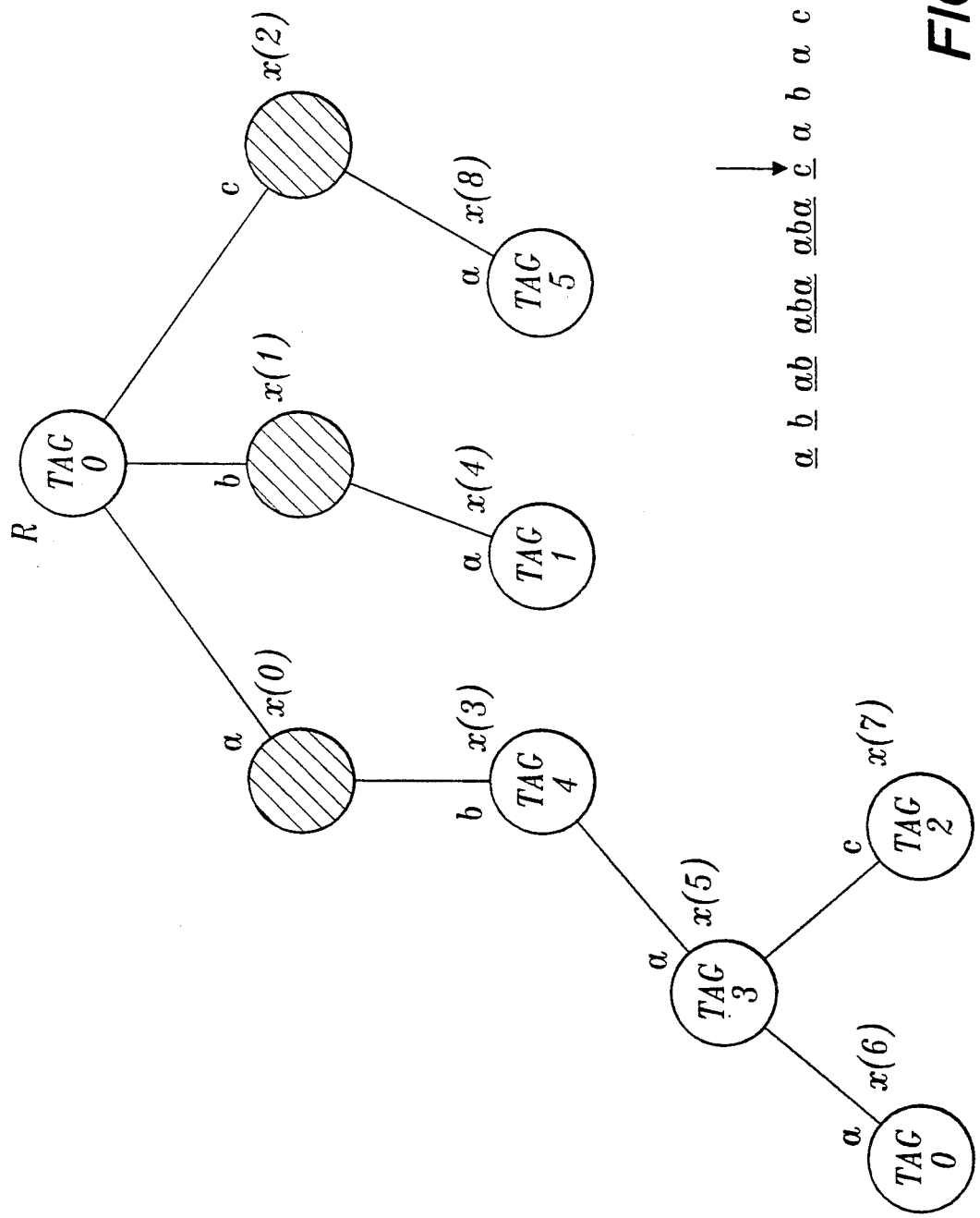
FIG. 3 is a schematic diagram of a trie data structure created during a compression procedure in accordance with the present invention.

With reference to FIG. 3, the present invention utilizes a tree data structure. In particular, a trie data structure with uniquely tagged and coded nodes is used. In such a trie, the tree edges have distinct labels; the labels are members of the alphabet $\Sigma$. Each node in the trie represents a string obtained by concatenating the edge labels along the root-to-node path. As with the strings entered in a string table, each string in the trie represents a string which, along with all of its prefixes, was matched in an input stream of characters. The trie in the example represents the dictionary that is created when the input string abababaabac is encoded through the first 12 characters.

In the example, the alphabet $\Sigma = \{a, b, c\}$, the dictionary size $D = 9$, and codes are represented by X. The root node R and its children are considered permanent nodes which will not be deleted from the dictionary. The remaining nodes are transient nodes; these nodes may be deleted. The number of transient nodes N is equal to the dictionary size D minus the alphabet size $|\Sigma|$. Thus, in the example, six transient node dictionary entries can be made for a total of nine dictionary entries. Tag is the variable that identifies the tag of a particular node.

In an implementation in which the root's children correspond to the permanent dictionary entries, the root's children are not tagged so they will not be deletion candidates. As will be described below, the tagging scheme results in the root having a root tag that corresponds to a leaf node tag. The particular leaf node terminates a path in the trie and that was first visited long ago, e.g., was not recently visited. Since the leaf has not recently been visited, relative to the other leaf nodes, the string has a lesser chance of being matched in the near future relative to the other leaf nodes. The node identified by the root tag must be freed before the next parsing pass so that dictionary additions may continue.

In one actual embodiment, the matching of a word from the input stream of characters to the dictionary is performed in accordance with the LZW scheme. Using the trie structure, the match of incrementally longer input strings follows a path down the trie; when an extension character is added to the matched string, a search of the child nodes of the longest matched string is made. In the trie implementation, each node is associated with a unique output code. During decompression, that code value is an address to the node related to the code.

Before encoding begins, the root's children are established and assigned unique codes. In one actual embodiment, the root's tag is a number between zero and the number of transient nodes $N-1$. In the present example, the root's tag is initialized to zero. At the beginning of a parse, the root's tag is saved in a temporary tag and the root's tag is updated. The longest input string from the stream of input characters is then parsed by matching the string character-by-character along a path in the tree. As a character in the input string is matched, the tag of the node corresponding to the matched character is updated. The node's tag is assigned the value of its parent's old tag. This is done by swapping the node's current tag with a temporary tag that was previously set to the node's parent's tag. In this manner, each parent's tag is passed to its child via the temporary tag as the matching process traverses down a branch.

When a match cannot be made with input string $\omega K$, the last node in $\omega$ gets a new child having an edge labeled with the unmatched character K. That new child is assigned the tag from the temporary tag, which is its parent's old tag.

One benefit of the present invention is that the tag updating process parallels the matching process. The computations related to maintaining the temporary tag are relatively low. Therefore, little additional computational overhead results from this implementation.

Once the dictionary fills, i.e., the number of transient nodes is N, the process continues unchanged, except that the node having a tag equal to the root's tag is deleted before each new parse begins. Using the described tagging technique, the root's tag always identifies a not recently visited leaf node. Thus, the node can be deleted without interrupting the trie structure.

Figure 4:
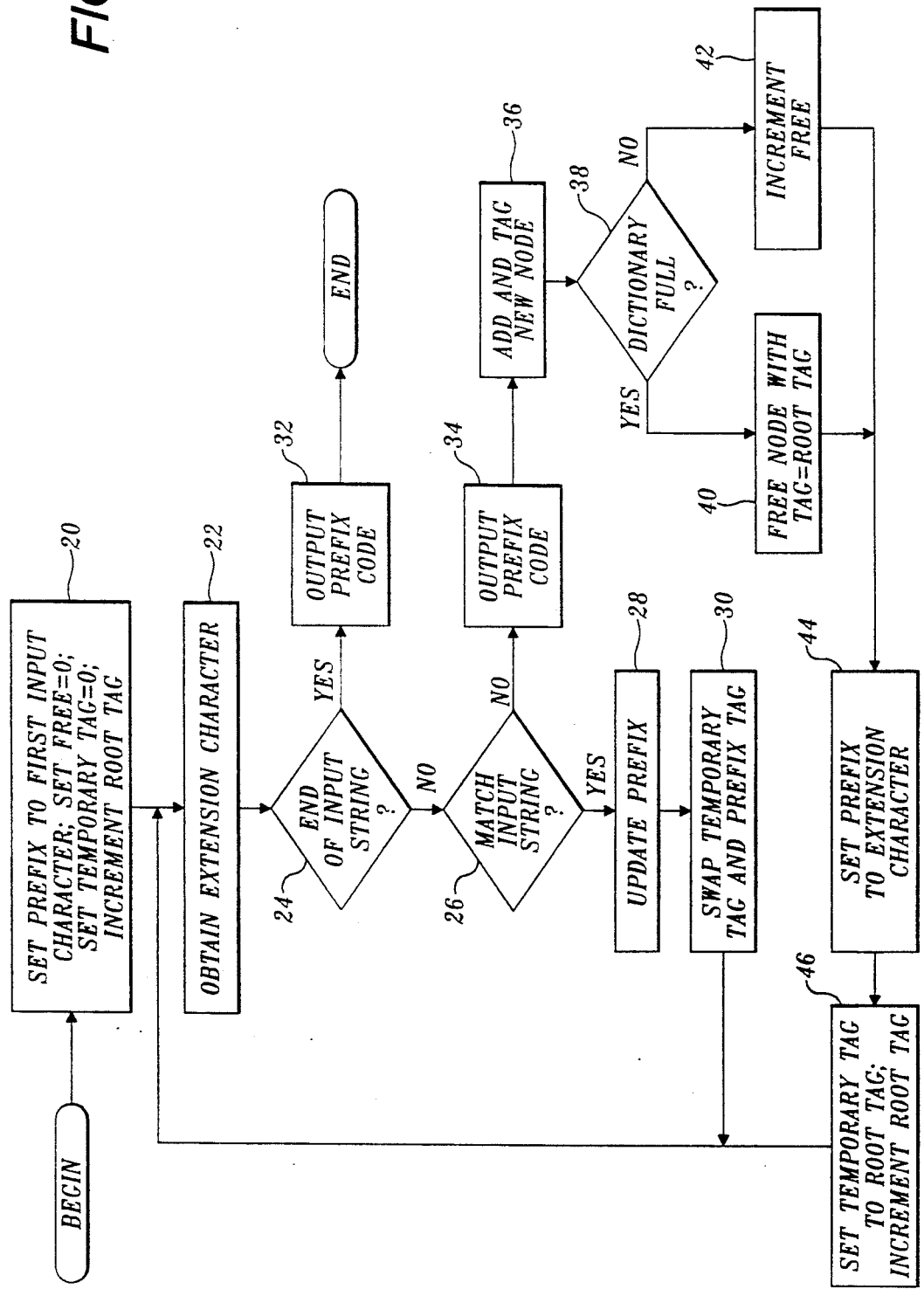
FIG. 4 is a flow diagram of a data compression method in accordance with the present invention.

With reference to FIG. 4, the steps described in conjunction with blocks 22-28 and 32-36 are similar to the steps carried out by an LZW scheme. The initialization steps, tagging steps, and dictionary-size control steps of the present invention, described in conjunction with the other blocks, are readily integrated into the LZW scheme.

At block 20, an initial match is performed. Because the characters in the alphabet are pre-established as root children, a character parsed from the input string, i.e, word of length 1, will always match a dictionary entry. The initialization at block 20 is related to that first match. A temporary tag is assigned the value of the root's tag, i.e., 0, and the root's tag is incremented as $(tag+1) \text{ MOD } N = 1$. Thus, the root tag takes on values sequentially. The prefix string $\omega$, which always represents a string that is matched in the trie, is set to the first character from the input string. In order to track the next available node in the tree, a variable free is set to 0. The variable identifies a set of nodes 0 to $N-1$ in the tree.

At block 22, an extension character K is obtained from the input string. If the input file is empty at block 24, the code for the prefix is output at block 32 and the encoding is completed. Otherwise, at block 26, an attempt is made to match the input string $\omega K$. If a match is found, then the prefix is updated to incorporate the extension character at block 28, e.g., $\omega = \omega K$. At block 30, the tag of the node identified by the new prefix is updated by swapping it with the temporary tag. The process returns to block 22 to continue matching.

If, at block 26, no match was found, at block 34 the code related to the prefix is output. At block 36, a new node is added to the trie. The node identified by the variable free is used. The node's parent is the prefix node, the node's edge is labeled with the extension character K, and the node's tag is set to the temporary tag, i.e., its parent's prior tag.

At block 38, a check is made to determine whether the dictionary is full. A simple counter may be initialized to 0 to block 20 and incremented each time a node is added at block 36. When the counter is greater or equal to the number of transient nodes N, the dictionary is full. If the dictionary is not full, the variable free is incremented by 1 at block 42. The next parse proceeds at block 22. If the dictionary is full, a node must be freed before the next parse takes place so that a new dictionary entry can be made at block 36 during the next pass. The node that has a tag equal to the root's tag is freed; the variable free is set to identify that freed node. It has been proven that the freed node is always a leaf node and is a node that was not recently visited. The next parse is then begun at block 22.

At blocks 44 and 46, the initial match steps for the next parse are performed. The next parse begins with the first unmatched character in the string, which is the character K from the previous parse. At block 44, the prefix $\omega$ is set as the extension character K. At block 46, the root tag is stored in the temporary tag and the root tag is updated.

Figure 5:
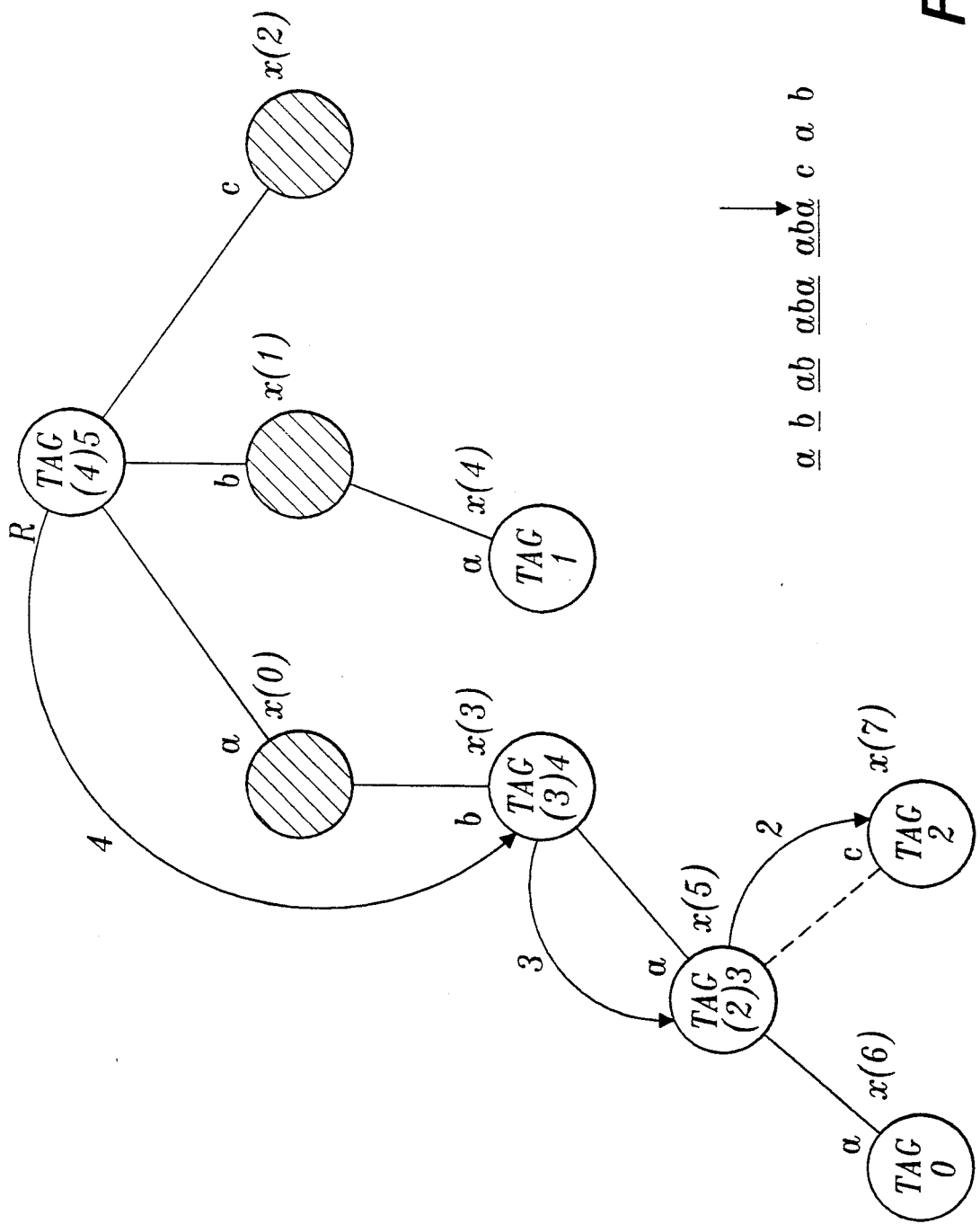
FIG. 5 is a schematic diagram of the trie data structure illustrated in FIG. 4, during the initial establishment of the trie.
Figure 6:
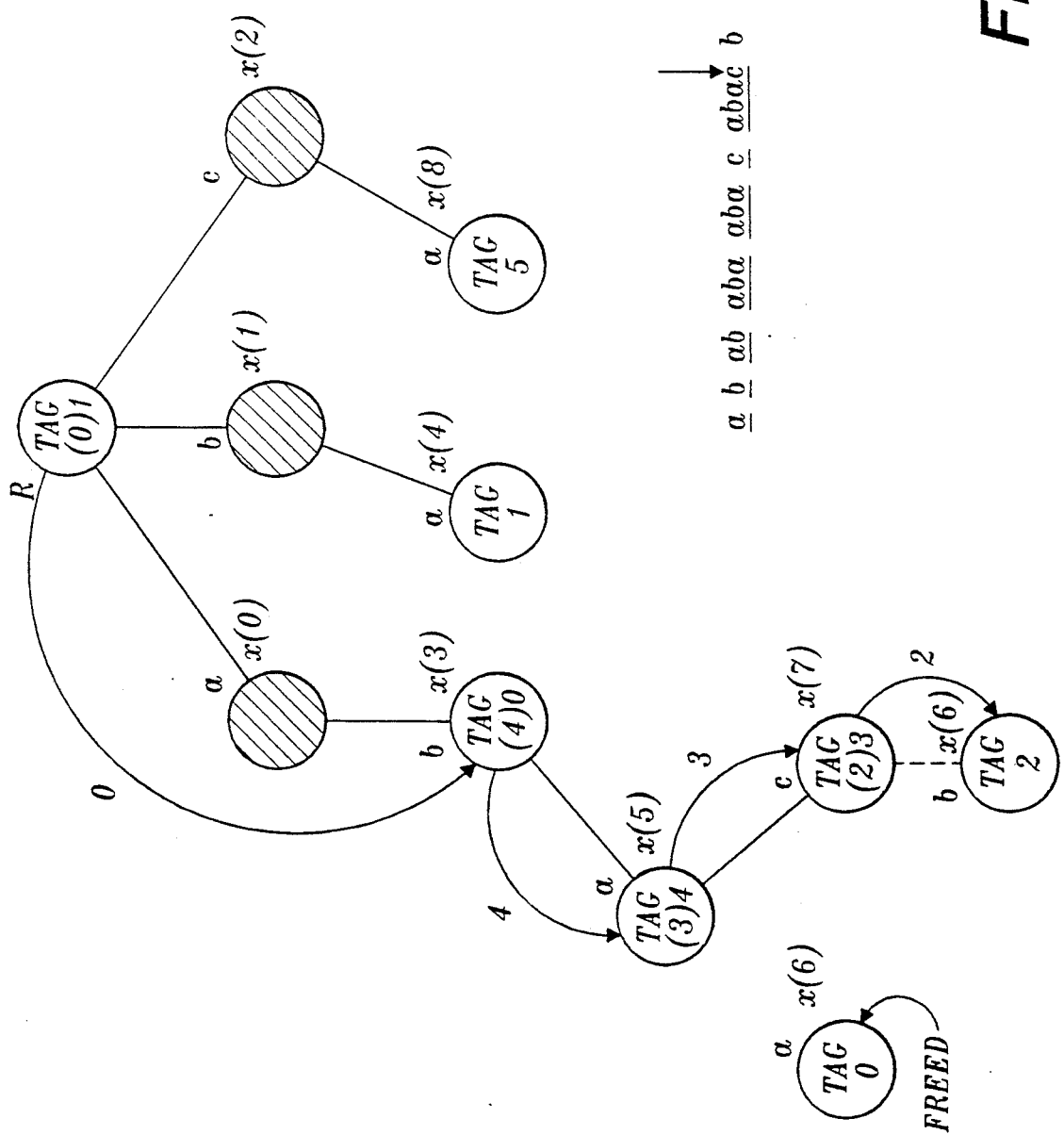
FIG. 6 is a schematic diagram of the trie data structure illustrated in FIG. 4, after another encoding pass is performed.

In FIG. 5, the trie structure modifications during the parsing of the underlined word in string ababababaabacab is illustrated. The arrows indicate the shifting down of the tag nodes as aba is matched and a node for extension character c is added to prefix path aba. When the match of aba is completed and the node added, all tags have been pushed down and the root's tag is updated. After the parse, the trie is the tree shown in FIG. 3 before a node is freed. With reference to FIGS. 3 and 6, the tree modification that occurs when the next string is parsed as illustrated in FIG. 6. Again, tag transitions are shown by arrows. Prior to the parse, the node with tag=0, i.e., the node with code X(6), is deleted since the dictionary is full and the node's tag matches the tag of the root. Once the match of string abac occurs, new node b is added as a child and is assigned code X(6). After the match, the root's tag is updated to $(0+1)$ MOD $N=1$. Thus, prior to the next parsing pass, node a with tag=1 will be freed. With reference to FIG. 7, a string table including the tags for the input character stream words is shown. In the FIGURE, t(y) represents the number of characters that have been parsed from the input string.

The trie may be represented as a table where each table entry consists of a pointer to a word's longest proper prefix, which is its parent, and to the word's last character. The dimensions of this table and the uniqueness of the node tags allow associative access to be simulated by two D-element arrays containing inverse mappings. For every input character, the process that maintains the node-to-tag mapping updates the tag of the trie node corresponding to the previous input. This tagging process runs in lock step with dictionary accesses.

The present invention thus provides a straightforward mechanism for identifying a trie node that can be deleted without interrupting the data structure and without deleting a word that was relatively recently used. The overhead incurred by the tagging scheme is a D word by logD bit associative look-up table that maps trie nodes to their tags. The trie must be read from and written to each time a node is visited in order to slide the tags down. Additionally, at word boundaries, a node-to-tag mapping is indexed with the root's tag to locate the next free node.

Figure 8:
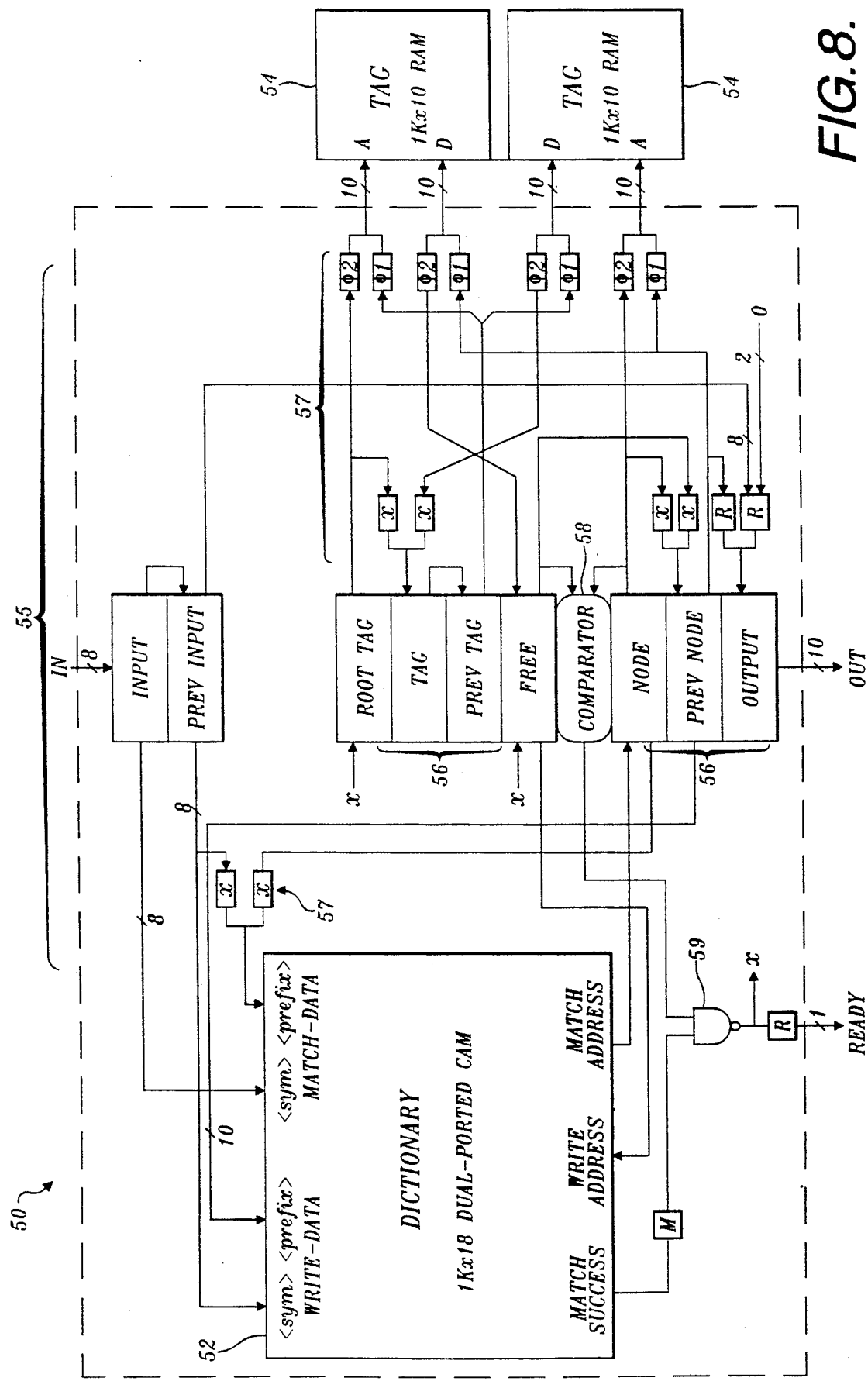
FIG. 8 is a block diagram of a hardware implementation of a data compression apparatus in accordance with the present invention.

With reference to FIG. 8, one encoder 50 designed in accordance with the present invention includes a 1K by 18-bit dual CAM 52 that can write and match simultaneously for storing the dictionary, two 1K by 10-bit RAMS 54 for storing the trie node-to-tag mapping and its inverse (TAG and TAG'), and a data path 55 composed of 90 bits of state 56, eight 10-bit two input multiplexers 57, a two input 10-bit comparator 58 and a set of NAND gates 59. The initialization circuitry (not shown) initializes most state variables to zero.

the one symbol words over the alphabet are hardwired into the first CAM locations. All operation on the chip is fully synchronized and governed by two global clock signals $\Phi_1$ and $\Phi_2$. When $\Phi_1$ goes high, all register and memory inputs are read. At the end of $\Phi_2$, all new values are latched and become available as outputs. During this entire period, there are two independent time critical data paths that are traversed in parallel. The first path goes from state registers to the CAM, which performs a match and back to the registers. The second path involves two steps. First, data from state variables must reach the TAG RAMs and then a write occurs. Next, when $\Phi_2$ goes high, data from state registers go to TAG RAMs again and read occurs, followed by a return from the RAMs to the state registers. A procedural description of the encoder is provided in FIG. 9. The first routine describes a Ziv-Lempel compressor which can stand alone, assuming an infinite dictionary. The second routine maintains the matching of nodes-to-tags, and determines the node to delete before each new parse begins. The tagging routine communicates with the compressor by sharing two variables, free and node, which are the addresses of the next unoccupied trie node and the current trie node, respectively. A third variable, prev-node can be shared or the tagging routine can keep its own copy. The procedural descriptions directly correspond to a register transfer description of a circuit, such as the encoder illustrated in FIG. 8, that consumes a new input every cycle, since the outcomes of all memory accesses are not used until the following cycle.

As with the data compression system of the present invention, the decompression system is similar to an LZW process but maintains tags related to the decoder dictionary entries. The dictionary management process is similar to the encoder dictionary management process. In one embodiment of the data decompressor, the system consists of three parallel processes: an LZW decoder, a tagging process, and a stack-queue manager. The decoder accepts codes, which are addresses of trie nodes, as input and outputs a character of decompressed data every cycle. The decoder's tagging routine is similar to the encoder's tagging routine. The stack-queue manager is necessary because the decoder generates the symbols of each parsed word in reverse order. In the present invention, the stack-queue fills with decoder output before it starts producing and then it too outputs a character of data every cycle.

A decompression system in accordance with the present invention decodes the coded information one code at a time. When a code is read, the node whose address equals the code is visited, and the node's character is buffered. Next, the parent of the currently visited node is visited and its character is sent to the output buffer. This continues until a root child is visited. At this point, the contents of the output buffer, which contains the last decoded word in reverse, are removed in last-in-first-out (LIFO) order and the process resumes, starting with the next code. At word boundaries, a new node is added to the beginning of the path corresponding to the previously decoded word. For example, a b ab, after the a and then b are decoded, a node for the extension character b was added as a child to root child a to form entry ab in the tree. The system waited for one more cycle, the decoding of b, before it could identify the extension character node that is to be added to root child a. The parent of the new node is the previous code. Thus, the previous code is saved for a cycle. This straightforward method must be modified for an abnormal case wherein the code represents a string $K\omega K\omega K$. The decompressor cannot decompress the suffix $K\omega K$ because it does not know an extension character K for the prior string $K\omega$. Thus, there is no code entry for the word. However, the decompressor can continue decoding because it knows that the unknown extension character is an extension of the previously decoded word. Methods are known for decoding such cases. In the present system, a method of tagging the nodes in this abnormal case is provided.

A tagged LZW decompression system maintains the tags in the trie by sliding the tags on the current path down one level as the path to the root is traversed. Just as the decompressor must wait through a decoded word to add a new node to the beginning of the previous path, the tagging process must wait for the next node, or current node, to be visited before sliding down the tag of the current node to its child. Further, the bottom most tag for each word is saved so that it can be assigned to the new node that is subsequently added to the trie. At word boundaries, i.e., after the decoder has visited a root child, if the dictionary is full, a node is deleted and the root tag incremented.

Figure 10A:
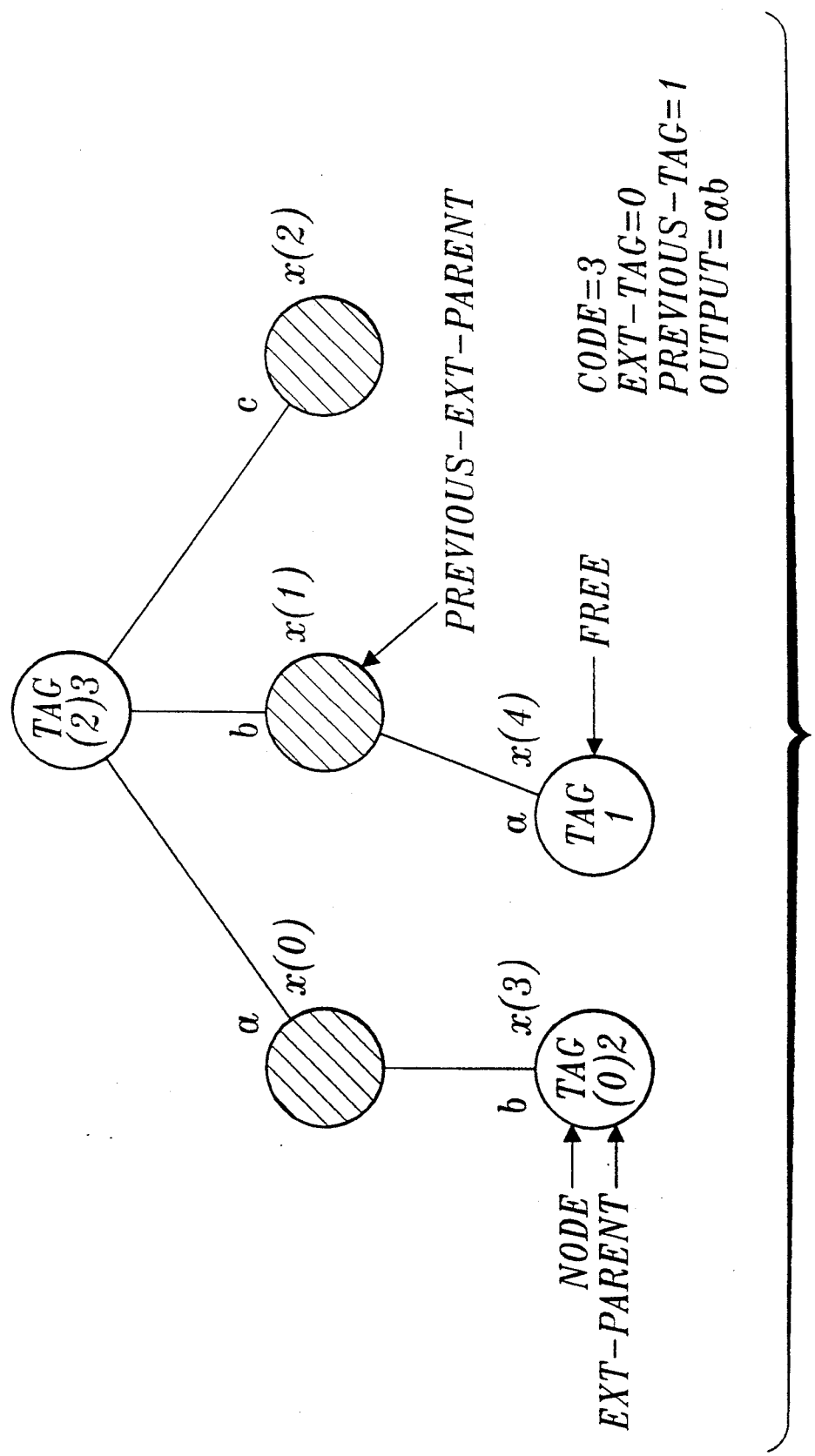
FIGS. 10a–c are schematic diagrams of a trie structure created in accordance with the decompressor of the present invention.
Figure 10B:
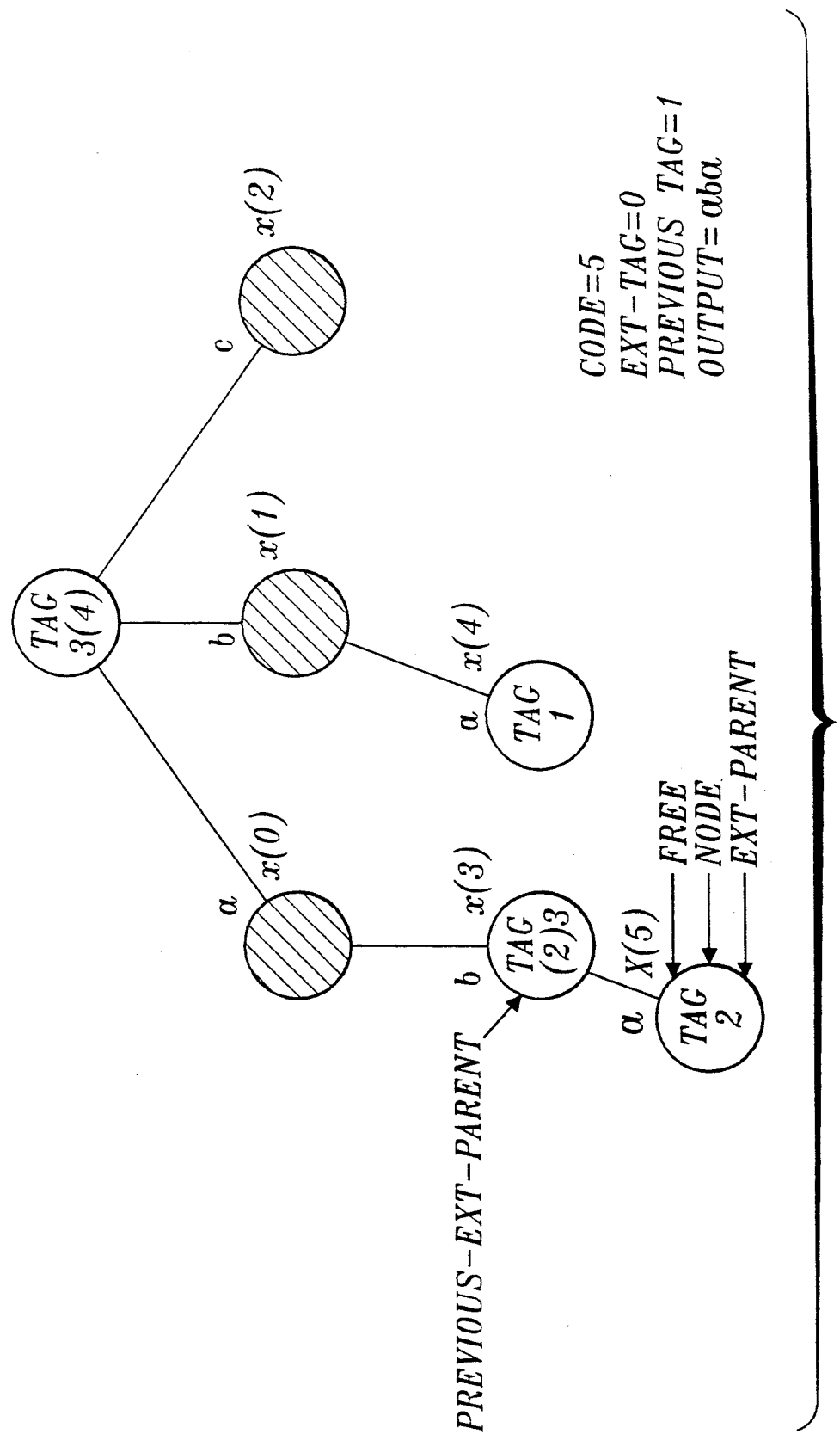
Figure 10C:
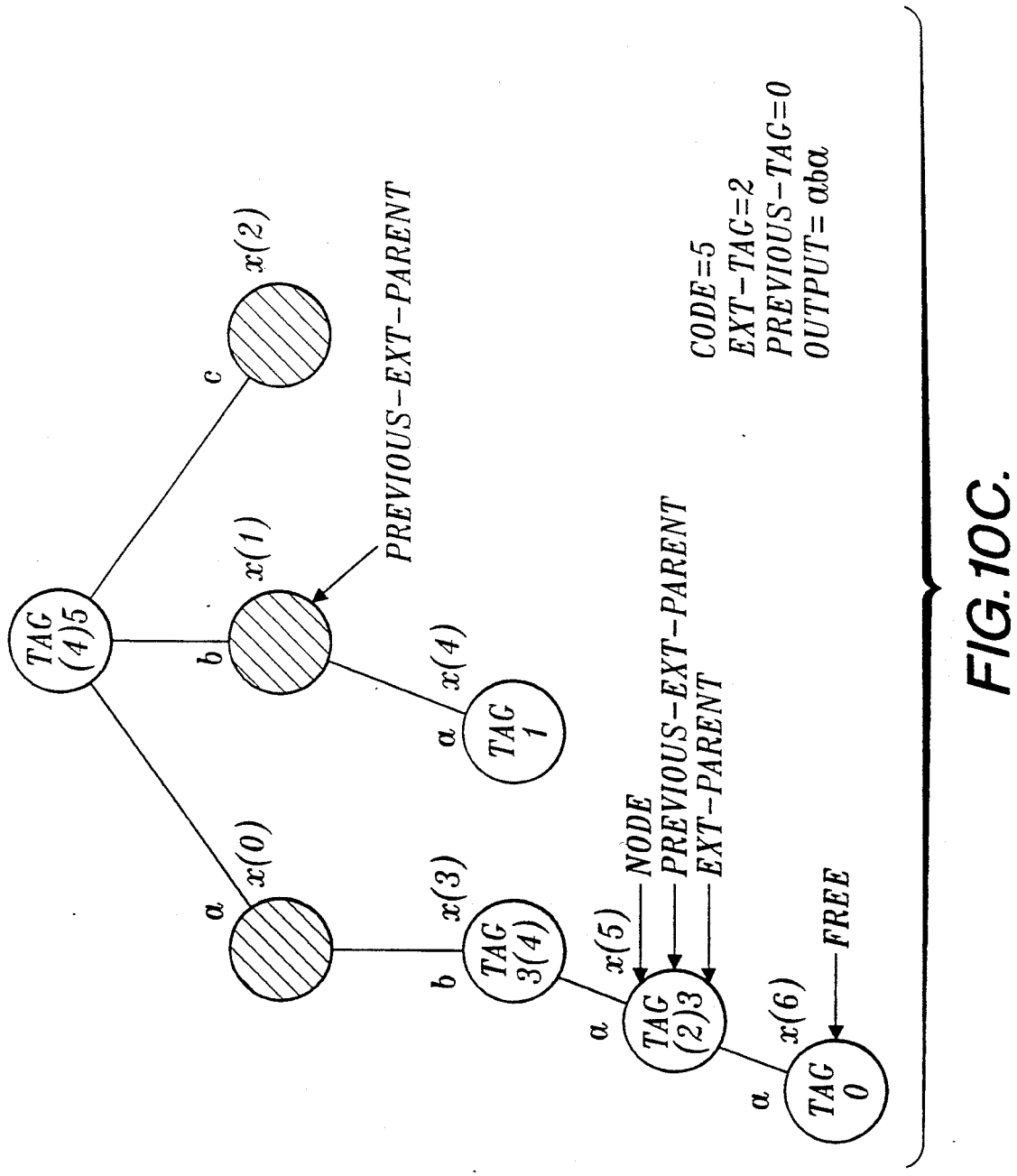

With reference to FIGS. 10a-c, a set of decoding passes and the various pointer assignments used to identify tags and new node placements are shown. The variables used are extension_parent, previous_extension_parent, extension_tag, and previous_extension_tag. The extension_parent identifies the leaf node of the string currently being decoded; the previous_extension_parent identifies the leaf node of the string that was last decoded. This is the string to which the first character in the next decoded string is added. The trie modifications illustrated in FIG. 10 can be viewed in conjunction with the flow diagram of FIG. 11. The trie configurations shown are configurations after a completed decoding pass after the root tag has been incremented for the next pass. The tag values for the previous pass are shown in parenthesis.

Figure 11:
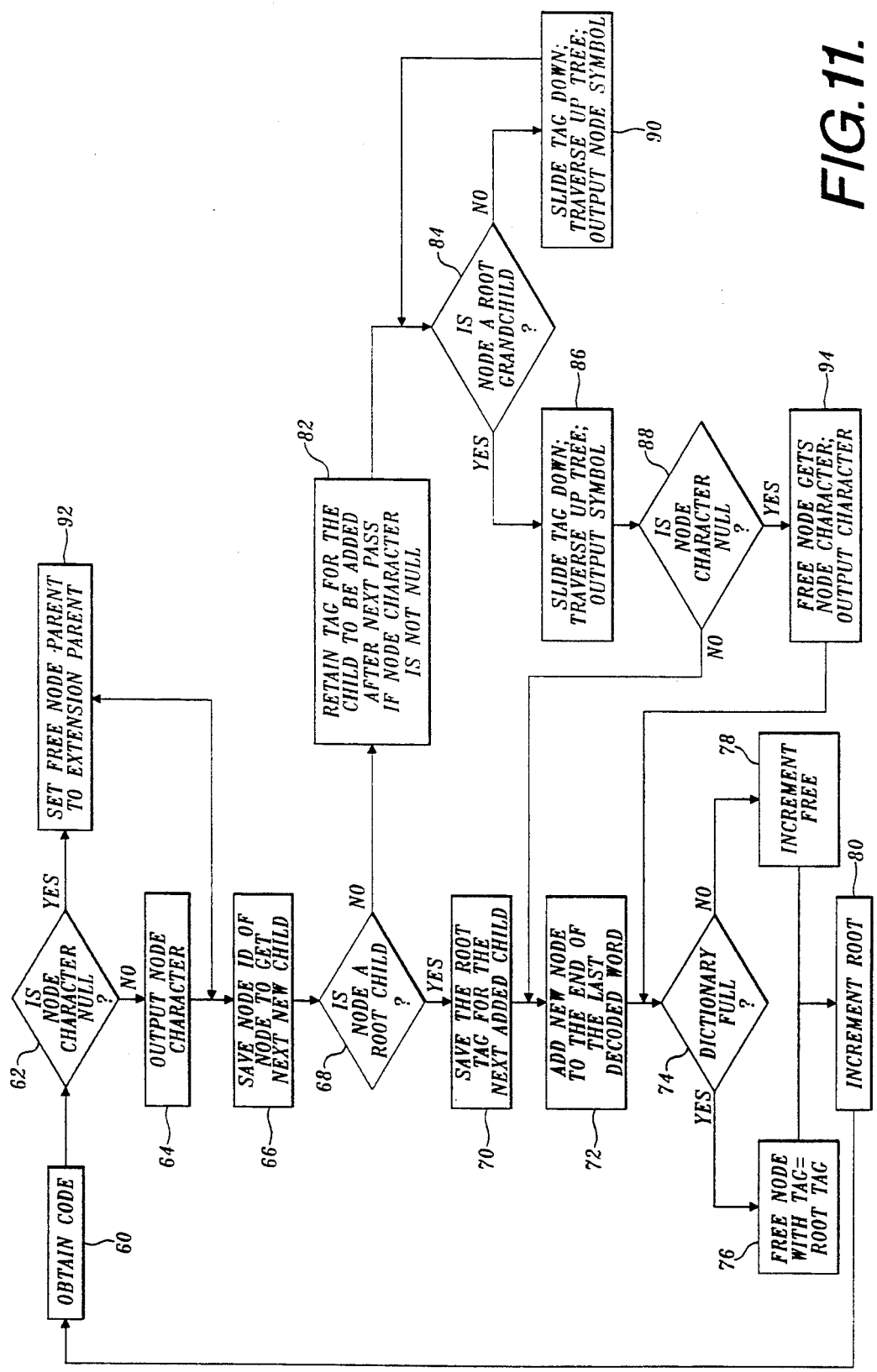
FIG. 11 is a flow diagram of a data decompression method in accordance with the present invention.

A decompression process is described with reference to FIG. 11. The process is similar to an LZW process with the exception of the tagging and dictionary control steps that are performed in conjunction with blocks 70, 82, 86 and 90, and 74-80, respectively. The abnormal decoding case is dealt with generally at blocks 82, 92, and 94. The initialization steps are not shown. Generally, a free variable is initialized to the first free node, a node variable is initialized to null, and the root tag is initialized to zero.

At block 60, a code, which is the address of a node, is obtained and assigned to the variable node. At block 62, a check is made to determine whether the node has an associated character. This is the check for the abnormal case when a code has been generated by the encoder but has not yet been entered in the decoding dictionary. If the node has an associated character, then at block 64 the character related to the node is output to the stack-queue. At block 64, the node identification in previous_extension_parent is set to extension_parent which points to the leaf node of the string that was last decoded and that will receive an extension character during this pass. The current node identification is saved in extension_parent since it will receive an extension character during the next pass.

Because the root child nodes are terminal nodes and do not receive tags, when a root child or its child is reached, special processing occurs. At block 68, a check is made to determine whether the current node is a root child. If it is, at block 70 the root tag is saved for assignment during the next pass since it will be the tag for the current node's child. Again, previous_extension_tag is assigned the extension_tag which is the tag that will be assigned during the present pass. Extension_tag is assigned the tag that will be assigned during the next pass.

The root child character is actually the beginning of a word since the output is decoded in reverse. Thus, that character is an extension character and is added to the end of the previously decoded word. At block 72, a new node identified by the free pointer is added to the end of the previously decoded string identified by the previous_extension_parent. The node is assigned the character of the root child. The node is also assigned the previous_extension_tag, which was the tag saved from its parent during the decoding pass.

At block 74, a check is made to determine if the dictionary is full. If it is, at block 76, the node having a tag equal to the root tag is deleted and the free variable is assigned to that node. Otherwise, at block 78 variable free is incremented. The root tag is incremented at block 80. As in the encoder system, the root tag is incremented as (tag+1) MOD N. The decoding process continues at block 60.

If, at block 68, the current node is not a root child, then the process traverses up the tree, outputting characters from each node and pushing down the tags. At block 82, if the node character is not null, i.e., this is a normal case, then the tag of the current node is saved since it will be assigned to the current node's child during the next pass. In order to save the information, previous_extension_tag is assigned extension_tag and the extension_tag is assigned the node's tag.

At block 84, a check is made to determine whether the current node is the grandchild of the root. This is a special case because the root child is not tagged and, thus, the grandchild tag must be assigned the root tag. If the node is a root grandchild, at block 86 the current node tag is set to the root tag, the parent node becomes the current node, and the character related to the current node is output. At this point, the current node is a root child. If the current node is not a root grandchild, the current node is assigned its parent's tag, the parent node becomes the current node, and the character related to the current node is output. The process then returns to block 84 and continues until a root grandchild is reached.

At block 88, a check is made to determine if the pass is an abnormal case. If it is not, the process continues at block 72.

With respect to the abnormal case, if the current node is found to have a null character at block 62, the free node's parent pointer is assigned to the extension_parent. In this manner, the free node becomes the child of the node that is expected to receive an extension character at the end of the pass. The process continues normally until block 82. At this point, tags are not saved since the free node's parent's tag can be passed directly to the free node without having to wait a pass. The last treatment of the abnormal case occurs at block 94. The free node is assigned the first character from the decoded word. This character is output and its positioning is dealt with by the stack-queue by known methods.

Using the present decoder, the decoding dictionary is maintained in accordance with the encoding process so that lossless compression is achieved. As with the encoding process, the decoding process can be run in parallel with an LZW decoder so as to reduce computational overhead. Procedural descriptions of the decoder process is illustrated in FIG. 12, in conjunction with an LZW decoder process.

In one hardware implementation of the decoder, the stack-queue process requires that a queue of character stacks is added to the end of the data path of the decoder. All that is required to implement it is a RAM the size of the dictionary RAM. This RAM needs to match the performance measures of the other four RAMS since it forms a read (pop) and a write (push) each cycle. The one-way communication between the decoder and the stack-queue is handled through a one-byte register reverse_out, along with a signal that flags word boundaries. Therefore, this RAM can be left off-chip without reducing throughput. A procedural description of the stack-queue is illustrated in FIG. 13.

While preferred embodiments of the invention have been illustrated and described, it will be appreciated that various changes can be made therein without departing from the spirit and scope of the invention. For example, in an alternative encoding implementation, the entire matching process may be carried prior to updating of the tags. The tree may then be traversed upwardly from the new leaf node to the root node, moving the parent's tag down to the child during the traversal. Additionally, the tag values may fall within any range X to Y, wherein $X+Z-1=Y$ and Z is the number of tags. Two variables would then be required to keep the master tag values within the desired range: one value for the master tag and one for a counter from 0 to Z. The general formula would be master tag=(counter+1)MOD Z+X. The counter would then be incremented at each iteration.

Both hashing and associative memory approaches are appropriate for implementing the present invention in hardware. Hashing results in a variable input rate, but bounded probe hashing lessens the resulting buffering burden at the cost of occasional lost tries nodes. These node losses do not affect the correctness of the system. In an embodiment utilizing a CAM, random access of the dictionary is not necessary for the encoder. However, the decoder requires random access instead of associative look-up and therefore cannot use the encoder's dictionary hardware, as it does not provide random access. Hashing is a hardware implementation alternative, as the encoder and decoder can easily employ the same dictionary hardware. Further, hashing is often preferred in high-performance software, since pointer-based data structures are comparatively inefficient in practice. Finally, an alternative decompression system outputs a tag or address value rather than an actual character. The system then includes a table to map the identifying tag or address value to the character. These are data management alternatives that might be used.

The embodiments of the invention in which an exclusive property or privilege is claimed are defined as follows:

1. An adaptive data compression and decompression method for compressing an input string of character signals over an alphabet $\Sigma$ into a string of output code signals while maintaining a data dictionary of size D, the method comprising the steps of:

establishing an encoding dictionary in memory comprised of stored string entries, wherein each stored string entry in said encoding dictionary represents a string of character signals encountered in said input string of character signals and each stored string entry is related to a unique output code signal, and wherein each stored string entry of length greater than one character is related to a unique string entry tag, maintaining an encoding master tag as an index to said string entry tags;

searching said input string of character signals by comparing said string to said stored string entries to determine a longest match;

outputting an output code signal related to said longest match;

adding an extended string entry related to said longest match followed by the next sequential unmatched character signal from said input string of character signals to said encoding dictionary;

associating an available output code with said extended string entry;

updating each string entry tag related to said extended string entry and to each stored string entry that is a prefix of said extended string entry based on said encoding master tag;

updating said encoding master tag; and if said encoding dictionary is full, prior to performing said step of searching, freeing a stored string entry having a string entry tag with a value that is equal to said encoding master tag value, whereby a stored string entry that is not a prefix to another string entry and which was not recently referenced in the encoding process is freed so that the encoding dictionary may adapt to the input string of character signals.

2. A method as claimed in claim 1, wherein said encoding dictionary is established as a trie structure having a root node, permanent child nodes and a set of transient nodes, the edge labels of said trie are characters from said alphabet $\Sigma$ such that a stored string entry in said encoding dictionary is associated with a related node and is identified by traversing a path from said root node to said related node and concatenating said characters along said path, said stored string entry, and all of its prefixes, representing strings of character signals encountered in said input string of character signals, the number of transient nodes N being equal to $D-|\Sigma|$, said root node has an encoding master tag and each transient node has an associated string entry tag, and each of said permanent child nodes and each transient nodes has an associated unique output code signal.

3. A method as claimed in claim 2, further including the step of initializing said encoding master tag prior to establishing said encoding dictionary to a value between 0 and $N-1$, and wherein said step of updating said encoding master tag includes the steps of:

assigning a new encoding master tag, such that said new encoding master tag equals (encoding master tag+1) MOD (number of transient nodes N); and wherein said step of updating each string entry tag includes the step of assigning to said string entry tag of each string entry related to said extended string entry and its prefixes the string entry tag of its parent node after each prefix string is matched.

4. A method as claimed in claim 3, wherein said step of deleting a stored string entry includes the step of identifying a stored string entry having an associated string entry tag equal to said encoding master tag, freeing said stored string entry node, and storing said stored string entry's associated output code as said available code.

5. A method as claimed in claim 3, wherein said step of assigning to said tag of each string entry the tag of its parent node is not performed if said matched node is a permanent node.

6. A method as claimed in claim 1, further comprising the step of decompressing code signals by:

establishing a decoding dictionary in memory comprised of stored string entries, wherein each string entry in said decoding dictionary represents a string of character signals decoded from said output code signals, such that each output code signal is an address to a location in said memory, and each stored string entry is related to a string entry tag;

maintaining a decoding master tag;

establishing a set of permanent stored string entries in said decoding dictionary such that each entry is related to a single character string from said alphabet $\Sigma$;

obtaining a current output code;

locating said current output code address in said decoding dictionary and outputting a current string entry at said current code address;

copying said stored string entry tag into a next tag;

updating said string entry tags related to said current string entry and to each stored string entry which is a prefix of said current string entry based on said decoding master tag;

entering a new string entry in said decoding dictionary comprised of a previously decoded string entry identified by a previous code followed by a first character from said current string entry;

assigning a tag to said new string entry tag;

updating said decoding master tag; and if said decoding dictionary is full, deleting said stored string entry identified by said decoding master tag.

7. A method as claimed in claim 6, wherein said step of assigning a tag to said new string entry tag includes assigning a previous tag to said new string entry tag followed by the steps of:

assigning said next tag to said previous tag;

assigning said current code to said previous code.

8. A method as claimed in claim 6, wherein:

said decoding dictionary is established as a trie structure having a root node, permanent child nodes and a set of transient nodes;

the edge labels of said trie are characters from said alphabet $\Sigma$ such that a stored string entry in said decoding dictionary is associated with a related node and is identified by traversing a path from said root node to related node and concatenating said characters along said path, said stored string entry and all of its prefixes representing strings of decoded character signals;

each stored string is related to a unique output code;

the number of transient nodes N being equal to $D-|\Sigma|$; and said root node has a decoding master tag and each transient node has an associated decoding string entry tag.

9. A method as claimed in claim 8, wherein said step of deleting a stored string entry includes the step of identifying a stored string entry having an associated string entry tag equal to said decoding master tag, freeing said stored string entry node, and assigning said output code related to said string entry to said previous code.

10. An adaptive data compression and decompression method for compressing an input string of character signals over an alphabet $\Sigma$ into a string of output code signals while maintaining a data dictionary of size D, the method comprising the steps of:

establishing an encoding dictionary in memory as a trie structure having a root node, permanent child nodes and a set of transient nodes, wherein: the edge labels of said trie are characters from said alphabet such that a stored string entry in said encoding dictionary is associated with a related node and is identified by traversing a path from said root node to said related node and concatenating said characters along said path, and said string entry and all of its prefixes represent strings of character signals encountered in said input string of character signals the number of transient nodes N being equal to $D-|\Sigma|$; each of said root nodes and said transient nodes has a unique associated tag, having a value between 0 and $N-1$, and each of said permanent child nodes and said transient nodes has an associated unique output code signal;

searching said string of input character signals by comparing said string to said stored string entries to determine a longest match string and its related node;

adding an available node related to a next sequential unmatched data character signal following said longest match string to said encoding dictionary as a child of the node related to said longest match string;

associating an available output code signal with said unmatched data character node;

outputting an output code signal associated with said longest match string;

assigning a new root tag, such that said new tag equals (root tag+1) MOD (number of transient nodes N);

assigning new tags to said transient nodes on a path between said root node and said unmatched data character string node, unless said matched node is a permanent node, such that each child node's new tag is set to its parent node's prior tag; and if said encoding dictionary is full, freeing a node having a tag equal to said root tag such that said node is then an available node.

11. A method as claimed in claim 10, wherein said step of searching is performed on a matched prefix string concatenated with an unmatched data character signal by:

obtaining a next sequential unmatched data character signal from said input string of characters;

beginning at a matched node related to a matched prefix string entry, searching the children of said matched node for said unmatched data character signal; and if said unmatched data character signal is matched in a child node, setting said child node as said matched node.

12. A method as claimed in claim 11, wherein said steps of assigning a new root tag and new tags to said transient nodes are performed in conjunction with said step of searching said string of input character signals and with a step of storing a temporary tag, such that said step of assigning a new root tag is performed after a first character in said input string of character signals is matched with a string entry; and when a next unmatched data character signal is matched during said searching process, passing a parent node's tag to its child node.

13. A method as claimed in claim 12, wherein said step of passing a parent's node tag to its child node is not performed if said matched node is a permanent node.

14. A method as claimed in claim 10, further including the decoding steps of establishing a decoding dictionary in memory as a trie structure having a root node, permanent child nodes and a set of transient nodes, wherein:

the edge labels of said trie are characters from said alphabet $\Sigma$ such that a stored string entry in said decoding dictionary is associated with a related node and is identified by traversing a path from said root node to said related node and concatenating said characters along said path, and said string entry and all of its prefixes represent decoding strings of character signals; the number of transient nodes N being equal to $D - |\Sigma|$; each of said root nodes and said transient nodes has a unique associated tag; and each of said permanent child nodes and said transient nodes has an associated unique output code signal;

maintaining a decoding master tag;

establishing a set of permanent stored string entries in said decoding dictionary such that each entry is related to a single character string from said alphabet $\Sigma$;

obtaining a current output code;

locating said current output code address in said decoding dictionary and outputting a current string entry at said address;

copying said stored string entry tag into a next tag;

updating said string entry tags related to said current string entry and to each stored string entry which is a prefix of said current string entry based on said decoding master tag;

entering a new string entry in said decoding dictionary comprised of a previously decoded string entry identified by a previous code followed by a first character from said current string entry;

assigning a previous tag to said new string entry tag;

assigning said next tag to said previous tag;

assigning said current code to said previous code;

updating said decoding master tag; and if said decoding dictionary is full, deleting said stored string entry identified by said decoding master tag.

15. An adaptive data compressor and decompressor for compressing an input string of character signals over an alphabet $\Sigma$ into a string of output code signals while maintaining a data dictionary of size D, the compressor comprising:

memory for storing a plurality of string entires in an encoding dictionary, wherein each stored string entry in said encoding dictionary represents a string of character signals encountered in said input string of character signals and each stored string entry is related to an output code signal, and wherein each stored string entry of length greater than one character is related to a string entry tag;

means for maintaining an encoding master tag as an index to said string entry tags;

means for searching said string of input character signals by comparing said string to said stored string entries to determine a longest match;

output means for outputting an output code signal related to said longest match;

means for adding an extended string entry related to said longest match followed by a next sequential unmatched data character signal from said input string of character signals to said encoding dictionary;

means for associating an available output code with said extended string entry;

means for updating said encoding master tag and each string entry tag related to said extended string entry and to each stored string entry that is a prefix of said extended string entry; and means for determining if said encoding dictionary is full and, if it is, for freeing a stored string entry having a tag identified by said encoding master tag prior to performing said step of searching.

16. A compressor and decompressor as claimed in claim 15, further including:

memory for storing a decoding dictionary, wherein each stored string entry in said decoding dictionary represents a string of data character signals decoded from said output code signals, such that each output code signal is an address to a location in said memory, and each stored string entry of length greater than one is related to a string entry tag;

means for obtaining a current code;

means for locating said current code address in said decoding dictionary and outputting a current string entry at said location;

updating means for storing in a next tag said current string entry tag and updating a master decoding tag, and for updating said string entry tags related to said current string entry and to each stored string entry including a prefix of said current string entry;

means for storing a new string entry in said decoding dictionary at a free address, said new string entry comprised of a previously decoded string entry identified by a previous code followed by a first character from said current string entry;

assigning means for assigning a tag to said new string entry tag, and updating said current code; and means for freeing a stored string entry associated with a tag identified by said decoding master tag if said decoding dictionary is full.

17. A data structure management method for managing a dynamic tree structure in a computer memory device, the tree including a root node and set of transient nodes, wherein the tree is traversed in a top-down fashion and has a maximum size, the method comprising the steps of:

associating a unique node tag value with each transient node;

maintaining a master tag value as an index to said node tags;

if said tree is full, freeing a transient node having a node tag value equal to said master tag value prior to adding a new node; and when a new transient node is added to said tree structure, updating said node tag values for each node for which said new transient node is an ancestor, based on said master tag value, and updating said master tag value.

18. A method as claimed in claim 17, wherein the number of transient nodes is equal to N; said method further includes the step of initializing said master tag value to a value between 0 and $N-1$; and said step of updating said master tag value includes calculating a new master tag value as (master tag value + 1) MOD (number of transient nodes N).

19. A method as claimed in claim 17, wherein said master tag value is associated with the root node and said step of updating said node tag values includes the step of assigning to each node tag value its parent's node tag value.

* * * * *

UNITED STATES PATENT AND TRADEMARK OFFICE
CERTIFICATE OF CORRECTION

PATENT NO. : 5,151,697
DATED : September 29, 1992
INVENTOR(S) : Suzanne Bunton

It is certified that error appears in the above-indentified patent and that said Letters Patent is hereby corrected as shown below:

| COLUMN | LINE | |
|---|---|---|
| 1 | 49 | "pratical" should read --practical-- |
| 2 | 44 | after "iteration" insert --, the first symbol-- |
| 3 | 51 | "Optionally" should read --Optimally-- |
| 6 | 62 | after "word" insert --would-- |
| 7 | 2 | "abovedescribed" should read --above-described-- |
| 9 | 24 | "abababaabacab" should read --abababaabacab-- |
| 10 | 3 | after "dual" insert --port-- |
| 10 | 11 | "the" should read --The-- |
| 13 | 61 | after "practice." start a new paragraph with "Finally" |
| 17 | 67 | "entires" should read --entries-- |
| 18 | 61 | after "and" insert --a-- |

Signed and Sealed this

Fifteenth Day of March, 1994

Attest:

BRUCE LEHMAN

*Attesting Officer*     *Commissioner of Patents and Trademarks*